(12) United States Patent
Nemati et al.

(10) Patent No.: US 12,379,992 B2
(45) Date of Patent: Aug. 5, 2025

(54) SYSTEM AND METHOD FOR PROTECTING DATA

(71) Applicant: Microsoft Technology Licensing, LLC, Redmond, WA (US)

(72) Inventors: Majid Anaraki Nemati, San Diego, CA (US); Terry M. Grunzke, Boise, ID (US); Brett K. Dodds, Boise, ID (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 7 days.

(21) Appl. No.: 18/334,938

(22) Filed: Jun. 14, 2023

(65) Prior Publication Data
US 2024/0419539 A1    Dec. 19, 2024

(51) Int. Cl.
*G06F 11/10*    (2006.01)
*G06F 11/07*    (2006.01)

(52) U.S. Cl.
CPC ...... *G06F 11/1068* (2013.01); *G06F 11/0793* (2013.01); *G06F 11/1072* (2013.01); *G06F 11/1076* (2013.01); *G06F 11/108* (2013.01); *G06F 11/1088* (2013.01); *G06F 11/1092* (2013.01); *G06F 11/1096* (2013.01)

(58) Field of Classification Search
CPC ............ G06F 11/1068; G06F 11/1072; G06F 11/1076; G06F 11/108; G06F 11/1088; G06F 11/1092; G06F 11/1096; G06F 11/0793

USPC ....... 714/784, 774, 777, 769, 770, 773, 800, 714/6.1, 6.12, 6.22, 6.24; 365/185.09, 365/200, 201
See application file for complete search history.

(56) References Cited

U.S. PATENT DOCUMENTS

| | | | | |
|---|---|---|---|---|
| 5,206,864 | A * | 4/1993 | McConnell | H03M 13/159 714/755 |
| 5,948,118 | A * | 9/1999 | Higurashi | H03M 13/15 714/768 |
| 7,711,068 | B2 * | 5/2010 | Shokrollahi | H03M 13/3761 375/296 |
| 8,037,389 | B2 | 10/2011 | Hwang | |
| 9,183,085 | B1 | 11/2015 | Northcott | |
| 9,236,976 | B2 * | 1/2016 | Shokrollahi | H04L 1/0041 |
| 11,340,986 | B1 * | 5/2022 | Yadav | H03M 13/2906 |
| 12,099,457 | B2 * | 9/2024 | Confalonieri | G06F 13/1694 |
| 2003/0237041 | A1 * | 12/2003 | Cole | H04L 25/4908 714/776 |

(Continued)

OTHER PUBLICATIONS

Rhee et al., Concatenated Reed-Solomon Code with Hamming Code for DRAM Controller, 2010, IEEE, pp. 291-295. (Year: 2010).*

(Continued)

*Primary Examiner* — John J Tabone, Jr.

(57) ABSTRACT

A method, computer program product, and computing system for defining one or more encoded symbols for data included within each of a plurality of memory dies of a memory module to define one or more groups of encoded symbols; generating Reed-Solomon parities for each group of encoded symbols; and recovering one or more portions of the data included within each of the plurality of memory dies of the memory module in the event of data corruption or die failure using one or more of the encoded symbols and the Reed-Solomon parities.

12 Claims, 9 Drawing Sheets

100

(56) References Cited

U.S. PATENT DOCUMENTS

| | | | | |
|---|---|---|---|---|
| 2005/0060628 A1* | 3/2005 | Spencer | ............. | G06F 11/1008 |
| | | | | 714/752 |
| 2011/0019769 A1* | 1/2011 | Shokrollahi | .......... | H04L 1/0041 |
| | | | | 714/E11.031 |
| 2012/0137195 A1* | 5/2012 | Bueb | ................ | H03M 13/2906 |
| | | | | 714/E11.034 |
| 2016/0147598 A1 | 5/2016 | Muralimanohar | | |
| 2017/0249207 A1 | 8/2017 | Sharon | | |
| 2017/0271029 A1* | 9/2017 | Wang | ...................... | G11C 29/42 |
| 2019/0349349 A1* | 11/2019 | Layouni | ................ | H04L 63/083 |
| 2019/0384671 A1 | 12/2019 | Chen et al. | | |
| 2020/0082900 A1 | 3/2020 | Amato | | |
| 2020/0394104 A1 | 12/2020 | Brooks | | |
| 2021/0194506 A1 | 6/2021 | Symons | | |
| 2022/0107751 A1 | 4/2022 | Gorobets | | |
| 2022/0200654 A1* | 6/2022 | Baier | ...................... | H04B 1/719 |
| 2022/0221997 A1* | 7/2022 | Navon | .................. | G06F 3/0673 |
| 2022/0221999 A1* | 7/2022 | Navon | .................. | G06F 3/0608 |
| 2023/0136990 A1* | 5/2023 | Ning | ................... | G06F 11/1012 |
| | | | | 714/764 |
| 2023/0141358 A1* | 5/2023 | Aldana | ................ | H04B 1/7163 |
| | | | | 375/130 |
| 2023/0164015 A1* | 5/2023 | Kim | .................. | H04W 56/0035 |
| | | | | 370/350 |
| 2023/0359367 A1* | 11/2023 | Nemati | .................. | G06F 3/0673 |
| 2023/0421179 A1* | 12/2023 | Aldana | ............. | H03M 13/6516 |
| 2024/0419541 A1 | 12/2024 | Nemati | | |

OTHER PUBLICATIONS

Chen et al., Error-Correcting Codes for Semiconductor Memory Applications: A State-of-the-Art Review, Mar. 1984, IBM, vol. 28 • No. 2, pp. 124-134. (Year: 1984).*

Dutta et al., Multiple Bit Upset Tolerant Memory Using a Selective Cycle Avoidance Based SEC-DED-DAEC Code, 2007, IEEE, pp. 1-6 (Year: 2007).*

International Search Report and Written Opinion received for PCT Application No. PCT/US2024/032334, Sep. 11, 2024, 13 pages.

International Search Report and Written Opinion received for PCT Application No. PCT/US2024/033473, Nov. 7, 2024, 17 pages.

Invitation To Pay Additional Fees received for PCT Application No. PCT/US2024/033473 Sep. 16, 2024, 9 pages.

Notice of Allowance mailed on Feb. 12, 2025, in U.S. Appl. No. 18/336,900, 08 pages.

Non-Final Office Action mailed on Oct. 1, 2024, in U.S. Appl. No. 18/336,900, 14 pages.

* cited by examiner

FIG. 4

SYSTEM AND METHOD FOR PROTECTING DATA

TECHNICAL FIELD

This disclosure relates to systems and methods for protecting data and, more particularly, to systems and methods for protecting data and metadata within DDR6 memory.

BACKGROUND

Some proposals for DDR6 memory allow for storage of sixty-four bits of data per cache line die and provide four additional bits per die, wherein a typical DDR6 module may include ten dies (for a total of 40 additional bits). Additionally or alternatively, these four additional bits per die may come from reading out the current on-die ECC bits used for on-die SEC on DDR5. These additional bits may be used to provide data protection for the data stored within the sixty-four bits of data storage space, but there are ways to provide such data protection without adding errors to error free dies.

The traditional way of protecting dies against random errors is to use on-die single error correction (SEC) for each die, which requires seven bits per die. For example, current DDR5 memory uses SEC (136,128) and 8 extra bits per die due to having to cover the ECC bits as well. And being the typical DDR6 module includes ten dies, a total of seventy bits are need to protect ten dies (of which only forty bits are available).

Approaches to provide data protection for these ten dies include combining the data on every few dies to provide SEC protection with the available forty bits. Unfortunately, these approaches have shortcomings including:
- In the event of a die failure, most probably one error will be added to either the failed die or one of the error free dies included in the same SEC block.
- The dies cannot be protected individually. Therefore, if two dies each have a single random error, a third error may be added (to either an error free die or one of the dies with error).
- There is not protection against a simultaneous die failure and single random errors on other dies in the same SEC block.

BRIEF DESCRIPTION OF THE DRAWINGS

Figure 4:
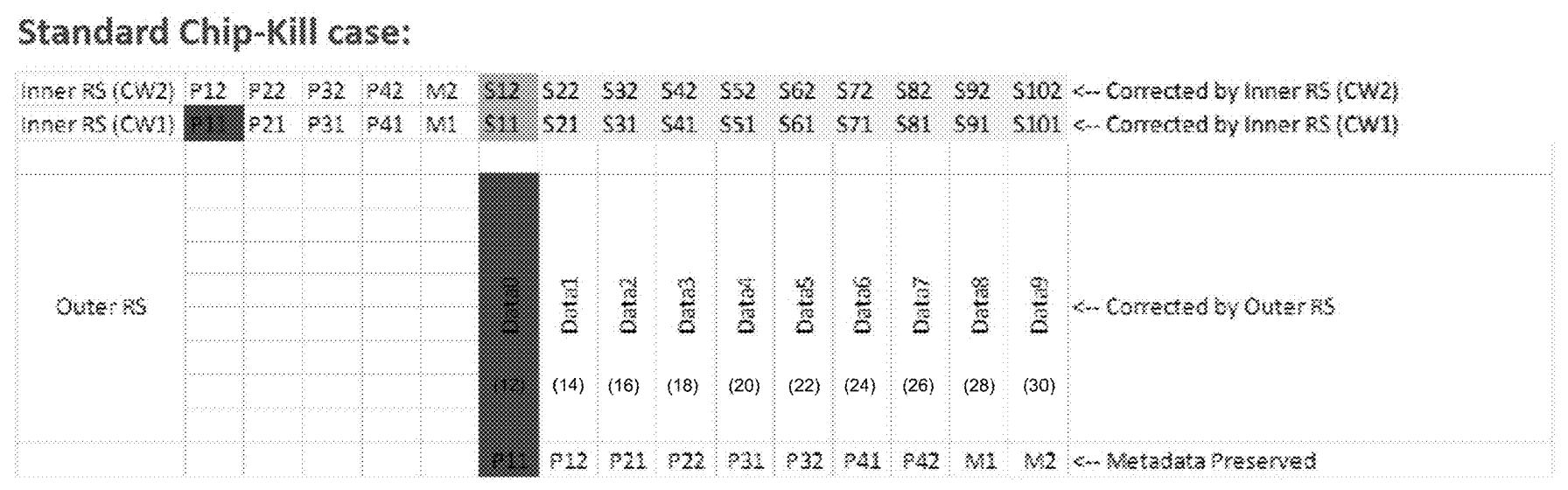

FIG. 4 is a diagrammatic view of a first failure type of the DDR6 memory of FIG. 1;

Like reference symbols in the various drawings indicate like elements.

DETAILED DESCRIPTION OF THE PREFERRED EMBODIMENTS

As will be discussed below in greater detail, implementations of the present disclosure are configured to enable the protection of data stored within DDR6 memory via the above-described forty additional data bits. Specifically, implementations of the present disclosure utilize a combination of SECDED (i.e., Single Error Correction/Double Error Detection) encoding and Reed-Solomon encoding to provide data protection for the above-described sixty-four bits of data via the forty additional bits, wherein a portion of those forty additional bits may be made available to provide storage for metadata.

The details of one or more implementations are set forth in the accompanying drawings and the description below. Other features and advantages will become apparent from the description, the drawings, and the claims.

Figure 1:
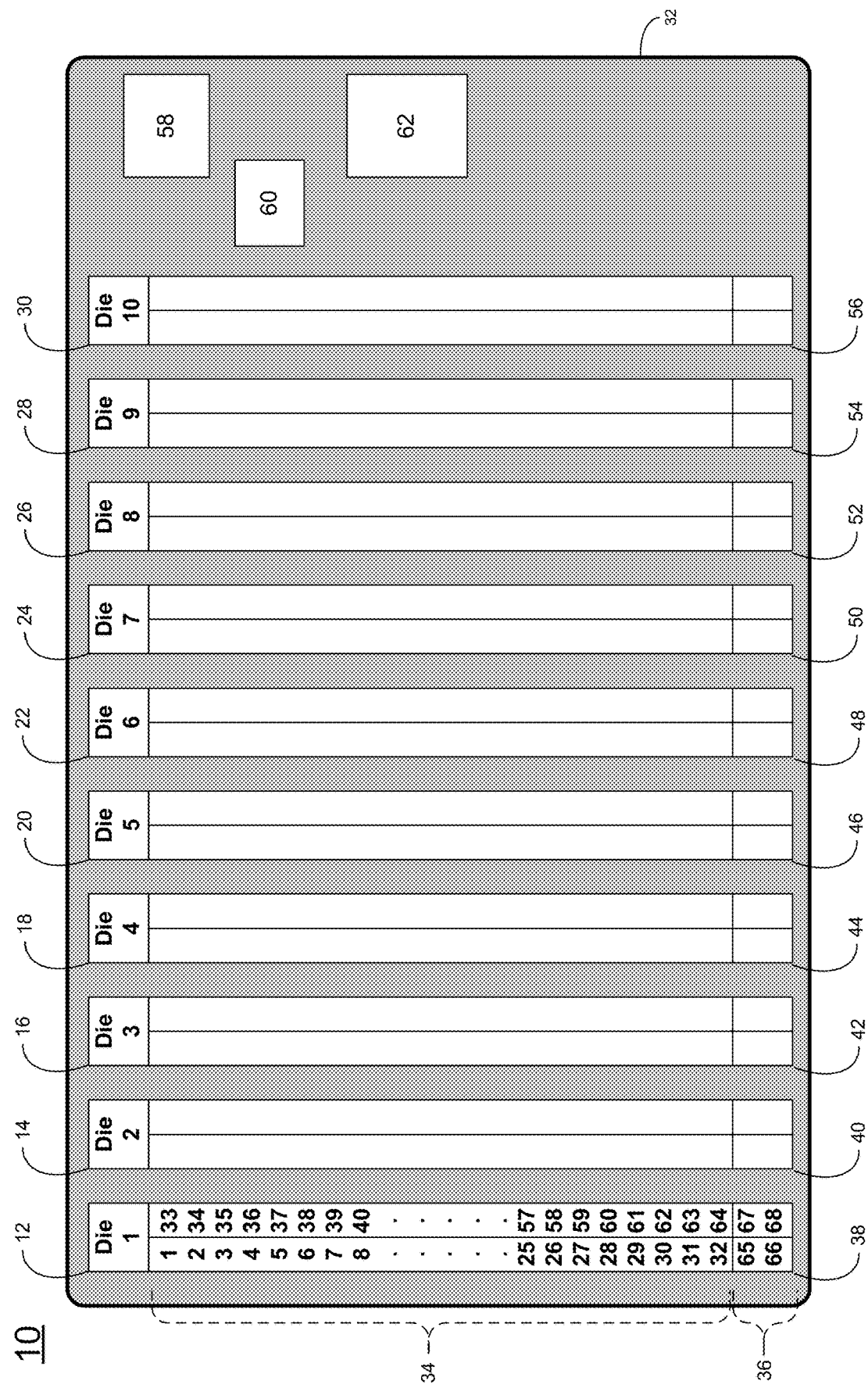
FIG. 1 is a diagrammatic view of DDR6 memory.

DDR6 Memory:

Referring to FIG. 1, there is shown DDR6 memory module 10. DDR6 memory module 10 (also known as Double Data Rate 6) is a type of computer memory technology that is used in high-performance computing systems, including desktop computers, server computers, and graphics cards. DDR6 memory module 10 is the successor to DDR5 and offers increased data transfer rates, higher capacities, and improved power efficiency compared to its predecessors. One of the key features of DDR6 memory module 10 is its higher data transfer rates. DDR6 memory modules may achieve speeds much faster that DDR5 transfer speeds. For example, DDR5 has transfer speeds of up to 6400-9600 MT/s (mega-transfers per second). The transfer speeds of DDR6 (while still in flux) may be >17,600 MT/s (mega-transfers per second), which is significantly faster than DDR5 memory. The increased data transfer rates of DDR6 memory allow for faster data access and improved overall system performance. Another advantage of DDR6 memory module 10 is its higher capacity. DDR6 memory can offer higher capacity options compared to DDR5, with likely capacities up to 64 Gb per die, while DDR5 memory currently has capacities up to 32 Gb per die. This allows for larger memory configurations in high-end systems, which can be beneficial for tasks that require a large amount of memory, such as gaming, content creation, and data-intensive applications. Further, DDR6 memory module 10 also incorporates improved power efficiency features, such as lower operating voltages and improved power management techniques. This can help reduce power consumption and heat generation, making DDR6 memory more energy-efficient compared to previous generations of DDR memory. Additionally, other benefits and advantages of DDR6 memory may be realized as the design of the same is refined and finalized.

In some implementations, DDR6 memory module 10 includes ten dies (e.g., dies 12, 14, 16, 18, 20, 22, 24, 26, 28, 30). For example, these ten dies (e.g., dies 12, 14, 16, 18, 20, 22, 24, 26, 28, 30) may be ten dies per rank per sub-channel. In the context of DDR6 memory module 10, a "die" refers to a discrete silicon chip that is part of DDR6 memory module 10. DDR6 memory modules are typically constructed using multiple memory dies (e.g., dies 12, 14, 16, 18, 20, 22, 24, 26, 28, 30) that are integrated onto a single circuit board (e.g., circuit board 32).

A memory die contains the memory cells, sense amplifiers, and other necessary components that enable data storage and retrieval. Each die (e.g., dies 12, 14, 16, 18, 20, 22, 24, 26, 28, 30) is organized into multiple banks, which are further divided into rows and columns of memory cells. The memory cells store binary data in the form of electrical charges, which are read and written using the sense amplifiers and other circuitry on the die.

Memory dies (e.g., dies 12, 14, 16, 18, 20, 22, 24, 26, 28, 30) in DDR6 memory modules are typically manufactured using advanced semiconductor fabrication processes, which involve the deposition and patterning of multiple layers of materials on a silicon substrate. These processes allow for the miniaturization of the memory cells and other components, which in turn enables higher memory capacities, faster data transfer rates, and improved power efficiency.

Multiple memory dies (e.g., dies 12, 14, 16, 18, 20, 22, 24, 26, 28, 30) are typically used in a single DDR6 memory module (e.g., DDR6 memory module 10) to achieve higher overall memory capacity. These dies (e.g., dies 12, 14, 16, 18, 20, 22, 24, 26, 28, 30) are often connected in parallel and controlled by a memory controller (not shown), which coordinates their operations and manages the flow of data between DDR6 memory module 10 and the rest of the system (not shown). This memory controller (not shown) may be a portion of a CPU (not shown) or an off-module device, such as a CXL controller (not shown). The number of memory dies (e.g., dies 12, 14, 16, 18, 20, 22, 24, 26, 28, 30) in a DDR6 memory module (e.g., DDR6 memory module 10) depends on the desired capacity and performance characteristics of the module.

As discussed above, each of the ten dies (e.g., dies 12, 14, 16, 18, 20, 22, 24, 26, 28, 30) included within DDR6 memory module 10 includes sixty-four data storage bits (e.g., data storage bits 34) and four additional bits (e.g., bits 36) that might be used for metadata or protection.

Data Protection Process:

As discussed above, the traditional way of protecting dies (e.g., dies 12, 14, 16, 18, 20, 22, 24, 26, 28, 30) against random errors is to use on-die single error correction (SEC) for each die (e.g., each of dies 12, 14, 16, 18, 20, 22, 24, 26, 28, 30). Unfortunately and as discussed above, such protection requires eight bits per die (e.g., seven bits for each of dies 12, 14, 16, 18, 20, 22, 24, 26, 28, 30). And being the typical DDR6 module (e.g., DDR6 memory module 10) includes ten dies (e.g., dies 12, 14, 16, 18, 20, 22, 24, 26, 28, 30), a total of seventy bits are needed to protect the data included within the sixty-four data storage bits (e.g., data storage bits 34) included within each of the ten die (e.g., each of dies 12, 14, 16, 18, 20, 22, 24, 26, 28, 30), of which only forty bits (e.g., additional bits 36) are available.

As also discussed above, implementations of the present disclosure are configured to enable the protection of data stored within DDR6 memory module (e.g., DDR6 memory module 10) via the above-described forty additional data bits. Specifically, implementations of the present disclosure utilize a combination of SECDED (i.e., Single Error Correction/Double Error Detection) encoding and Reed-Solomon encoding to provide data protection for the above-described sixty-four bits of data via the forty additional bits, wherein a portion of those forty additional bits may be made available to provide storage for metadata.

Figure 2:
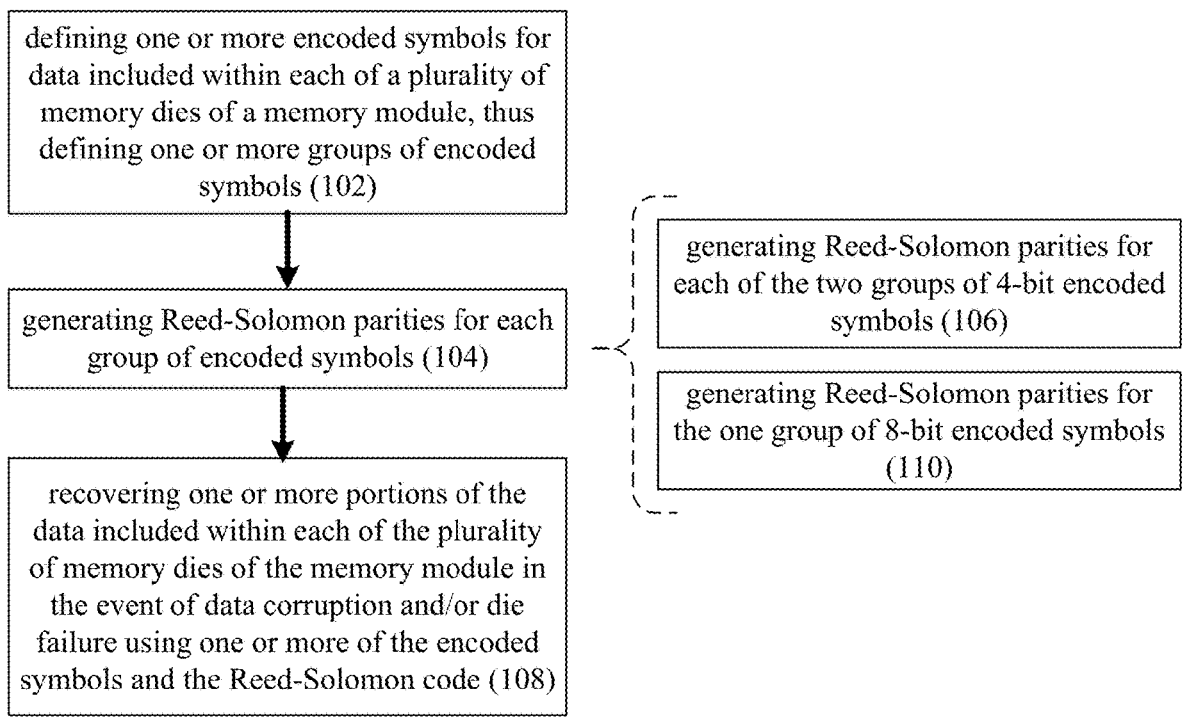
FIG. 2 is a flow chart of one implementation of a data protection process according to an embodiment of the present disclosure.
Figure 3:
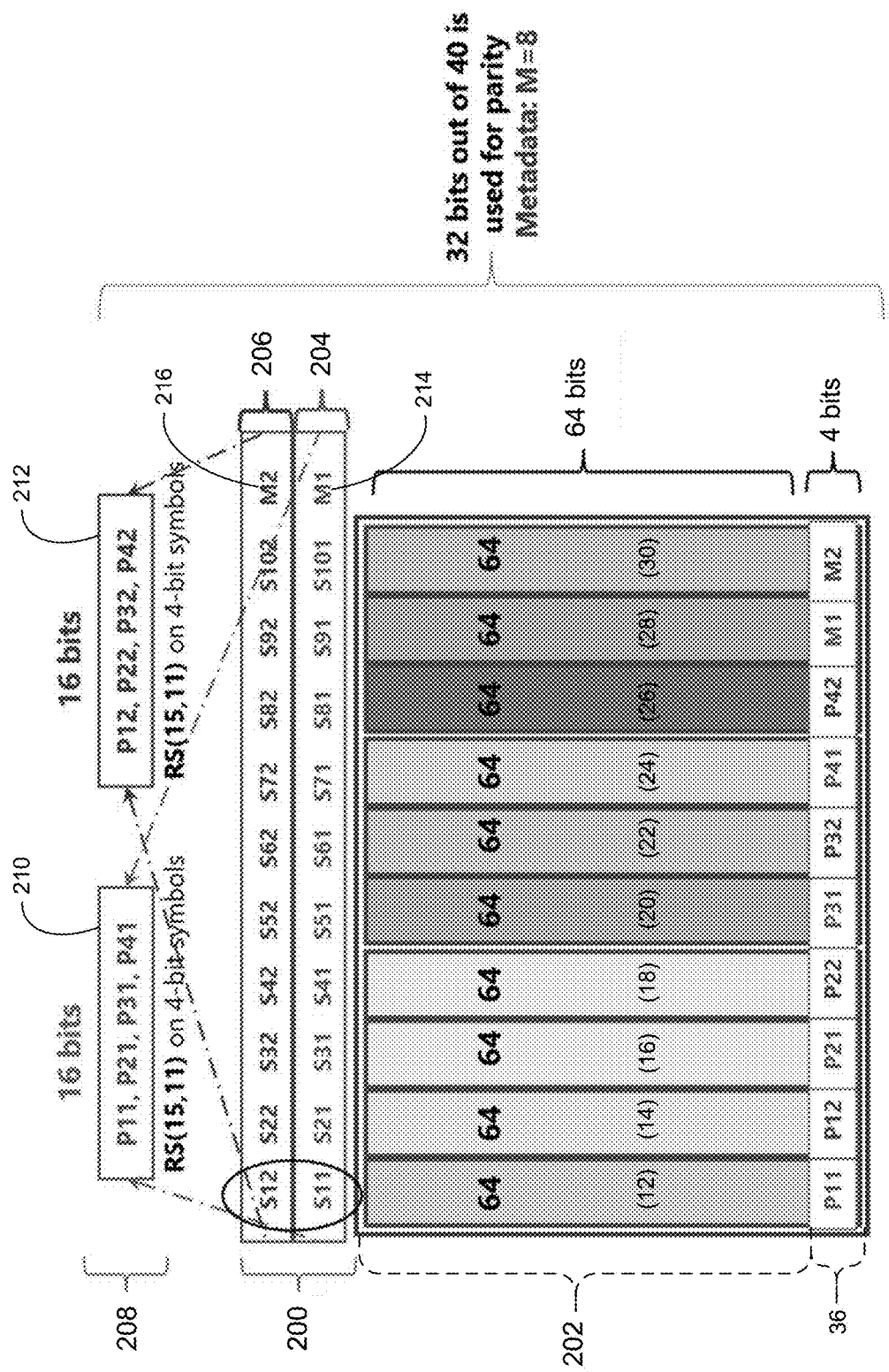
FIG. 3 is a diagrammatic view of a DDR6 memory and one implementation of the data protection process of FIG. 2.

Referring also to FIGS. 2-3, data protection process 100 may define 102 one or more encoded symbols (e.g. encoded symbols 200) for data (e.g., data 202) included within each of a plurality of memory dies (e.g., each of dies 12, 14, 16, 18, 20, 22, 24, 26, 28, 30) of a memory module (e.g., DDR6 memory module 10), thus defining one or more groups of encoded symbols (e.g., encoded symbol groups 204, 206). As will be discussed below in greater detail, two symbol groups (e.g., encoded symbol groups 204, 206) are formed to allow for the generation of two distinct RS parities (i.e., one for each of encoded symbol groups 204, 206).

An encoded symbol refers to a representation of information or data that has been transformed or encoded using a specific system or method. Encoding involves converting data into a different format or representation that may be more suitable for storage, transmission, or processing. Encoded symbols can take various forms depending on the encoding scheme being used. For example, in computer systems, binary encoding is commonly used, where information is represented using a sequence of 0s and 1s. Other encoding schemes include alphanumeric encodings (such as ASCII or Unicode), where characters are represented by numerical codes, or more complex encoding methods like Huffman coding or Run-Length Encoding (RLE) used for data compression. The purpose of encoding is often to reduce data size, improve efficiency, or enable compatibility between different systems. The encoded symbols allow for the preservation and retrieval of the original information by using a specific decoding algorithm that can reverse the encoding process and restore the original data. Examples of the one or more encoded symbols (e.g. encoded symbols 200) may include but are not limited to one or more SECDED encoded symbols. SECDED (Single Error Correction, Double Error Detection) is a type of error-correcting code used in computer memory and storage systems. It is designed to detect and correct single-bit errors, and to detect double-bit errors. In a memory system using SECDED, each data word is accompanied by an extra bit or bits that are calculated based on the contents of the data word. These extra bits are then stored along with the data word. When the data word is read from memory, the system uses the extra bits to detect and correct any single-bit errors that may have occurred during storage or transmission. If a double-bit error is detected, the system will recognize that the data is corrupted beyond repair and take appropriate action, such as requesting a retransmission of the data. SECDED is an important technology for ensuring the reliability and integrity of computer memory and storage systems, and is widely used in applications where data accuracy is critical, such as in aerospace, defense, and medical devices.

SECDED codes are calculated using a mathematical algorithm that involves adding redundant bits to the data word being transmitted or stored. The extra bits are calculated in such a way that they can be used to detect and correct errors. The SECDED algorithm uses Hamming codes, which are a class of linear error-correcting codes. The Hamming code adds parity bits to the data word based on its binary representation. The parity bits are chosen so that they allow the receiver to detect and correct any single-bit errors that may have occurred during transmission.

To add the redundant bits to the data word using the SECDED algorithm, the following steps are typically followed:

Determine the number of bits in the data word, which is represented by "n".

Determine the number of redundant bits needed, which can be calculated as "r=ceil(log 2(n+1))", where "ceil" is the ceiling function.

Create an empty codeword of length "n+r".

Fill in the data bits of the codeword with the original data.

Calculate the redundant bits based on the Hamming code algorithm. These bits are typically calculated by XORing specific subsets of the data bits in the codeword. The exact calculation method depends on the specific SECDED code being used.

Store or transmit the codeword, which now includes the original data and the redundant bits.

Overall, the SECDED algorithm adds redundancy to data in a way that allows for efficient detection and correction of errors, improving the reliability and integrity of computer memory and storage systems.

Data protection process 100 may generate 104 RS parities (e.g., RS parities 208) for each group of encoded symbols (e.g. encoded symbol groups 204, 206 of encoded symbols 200), wherein implementations of the RS parities (e.g., RS parities 208) may include codewords that enable the restoration of lost or corrupted data.

Examples of the RS parities (e.g., RS parities 208) may include but are not limited to a Reed-Solomon codeword. Reed-Solomon is a type of error-correcting code that is commonly used in digital communication systems, such as satellite and wireless communication, as well as in storage systems, such as CD, DVD, and Blu-ray discs.

Reed-Solomon codes use a combination of error detection and correction techniques to protect against errors in data transmission or storage. They work by adding redundant information, or parity check symbols, to the data being transmitted or stored. These parity check symbols allow the receiver to detect and correct any errors that may have occurred during transmission or storage. The Reed-Solomon code is based on the theory of finite fields, which are mathematical structures that allow arithmetic operations to be performed on a limited set of elements. The Reed-Solomon code is designed to work over any finite field.

The Reed-Solomon encoding process typically involves several steps:

The data to be encoded is split into blocks, each containing a fixed number of symbols.

A number of parity symbols are generated based on the data symbols in each block. The number of parity symbols is determined by the desired level of error correction.

The data symbols and parity symbols are combined to form a larger block, which is transmitted or stored.

The decoding process involves the following steps:

The received block is split into its data and parity symbols.

The received data symbols are checked for errors using the received parity symbols.

If errors are detected, the decoder uses the parity symbols to correct the errors.

Reed-Solomon codes are particularly useful in situations where errors are likely to occur in bursts, as they can correct multiple errors in a single block. They are also efficient in terms of the number of parity symbols required to provide a given level of error correction, making them well-suited for use in low-bandwidth communication channels or storage systems with limited space.

A particular example of a Reed-Solomon encoding technique may include but is not limited to RS(15,11). RS(15,11) refers to a Reed-Solomon code with 15 total symbols, where 11 symbols are used for data and 4 symbols are generated parity symbols. In the case of RS(15,11), the code is capable of correcting up to two symbol errors, meaning that it can recover the original data even if up to two of the symbols are corrupted or lost. Higher recovery can be achieved if the locations of the errors is known. For example, two symbol errors may be corrected if the location of the errors is unknown; three symbol errors may be corrected if the location of two errors is known; and four symbol errors may be corrected if the location of all four errors is unknown.

Double RS Code Calculation:

The one or more encoded symbols (e.g. encoded symbols 200) for data (e.g., data 202) included within each of a plurality of memory dies (e.g., each of dies 12, 14, 16, 18, 20, 22, 24, 26, 28, 30) of a memory module (e.g., DDR6 memory module 10) may include: two 4-bit encoded symbols for data (e.g., data 202) included within each of a plurality of memory dies (e.g., each of dies 12, 14, 16, 18, 20, 22, 24, 26, 28, 30) of a memory module (e.g., DDR6 memory module 10), thus defining two groups of 4-bit encoded symbols (e.g. encoded symbol groups 204, 206 of encoded symbols 200).

For example, encoded symbols 200 that represent the data (e.g., data 202) included within each of a plurality of memory dies (e.g., each of dies 12, 14, 16, 18, 20, 22, 24, 26, 28, 30 of DDR6 memory module 10) may include: 4-bit encoded symbols group 204 and 4-bit encoded symbols group 206, resulting from an 8-bit symbol (broken into two 4-bit chunks) for each of dies 12, 14, 16, 18, 20, 22, 24, 26, 28, 30.

For example and through the use of the above-described SECDED algorithm:

the data included within die 12 of DDR6 memory module 10 may generate 8 bits SECDED parity, and divided into 4-bit symbol S11 and 4-bit symbol S12 that are representative of such data and allow for its recovery in the event of corruption/loss;

the data included within die 14 of DDR6 memory module 10 may generate 8 bits SECDED parity, and divided into 4-bit symbol S21 and 4-bit symbol S22 that are representative of such data and allow for its recovery in the event of corruption/loss;

the data included within die 16 of DDR6 memory module 10 may generate 8 bits SECDED parity, and divided into 4-bit symbol S31 and 4-bit symbol S32 that are representative of such data and allow for its recovery in the event of corruption/loss;

the data included within die 18 of DDR6 memory module 10 may generate 8 bits SECDED parity, and divided into 4-bit symbol S41 and 4-bit symbol S42 that are representative of such data and allow for its recovery in the event of corruption/loss;

the data included within die 20 of DDR6 memory module 10 may generate 8 bits SECDED parity, and divided into 4-bit symbol S51 and 4-bit symbol S52 that are representative of such data and allow for its recovery in the event of corruption/loss;

the data included within die 22 of DDR6 memory module 10 may generate 8 bits SECDED parity, and divided into 4-bit symbol S61 and 4-bit symbol S62 that are representative of such data and allow for its recovery in the event of corruption/loss;

the data included within die 24 of DDR6 memory module 10 may generate 8 bits SECDED parity, and divided into 4-bit symbol S71 and 4-bit symbol S72 that are representative of such data and allow for its recovery in the event of corruption/loss;

the data included within die 26 of DDR6 memory module 10 may generate 8 bits SECDED parity, and divided into 4-bit symbol S81 and 4-bit symbol S82 that are representative of such data and allow for its recovery in the event of corruption/loss;

the data included within die 28 of DDR6 memory module 10 may generate 8 bits SECDED parity, and divided into 4-bit symbol S91 and 4-bit symbol S92 that are representative of such data and allow for its recovery in the event of corruption/loss; and the data included within die 30 of DDR6 memory module 10 may generate 8 bits SECDED parity, and divided into 4-bit symbol S101 and 4-bit symbol S102 that are representative of such data and allow for its recovery in the event of corruption/loss.

When generating 104 RS parities (e.g., RS parities 208) for each group of encoded symbols (e.g. encoded symbol groups 204, 206 of encoded symbols 200), data protection process 100 may generate 106 the RS parities (e.g., RS parities 208) for each of the two groups of 4-bit encoded symbols (e.g. encoded symbol groups 204, 206).

For example, data protection process 100 may generate 106 a 16-bit RS parity (e.g., RS parity 210) for encoded symbol group 204 by processing the ten 4-bit symbols (e.g., symbols S11, S21, S31, S41, S51, S61, S71, S81, S91, S101) included within encoded symbol group 204. In this particular example, RS parity 210 is 16 bits in total length and includes four 4-bit parities (e.g., P11, P21, P31, P41).

Further, data protection process 100 may generate 106 a 16-bit RS parity (e.g., RS parity 212) for encoded symbol group 206 by processing the ten 4-bit symbols (e.g., symbols S12, S22, S32, S42, S52, S62, S72, S82, S92, S102) included within encoded symbol group 206. In this particular example, RS parity 212 is 16 bits in total length and includes four 4-bit parities (e.g., P12, P22, P32, P42).

As discussed above, RS(15,11) refers to a Reed-Solomon code that processes 11 input symbols to generate 4 parity symbols (for a total of 15 symbols). Since encoded symbol group 204 includes only ten 4-bit symbols (e.g., symbols S11, S21, S31, S41, S51, S61, S71, S81, S91, S101), one 4-bit symbol is available for storing 4-bits of metadata (e.g., metadata 214). Further, since encoded symbol group 206 includes only ten 4-bit symbols (e.g., symbols S12, S22, S32, S42, S52, S62, S72, S82, S92, S102), one 4-bit symbol is available for storing 4-bits of metadata (e.g., metadata 216).

As discussed above, each of the ten dies (e.g., dies 12, 14, 16, 18, 20, 22, 24, 26, 28, 30) included within DDR6 memory module 10 includes sixty-four data storage bits (e.g., data storage bits 34) and four additional bits (e.g., additional bits 36) for use in protecting the data stored within data storage bits 34. Accordingly and through the use of data protection process 100, the data (e.g., data 202) included within each of a plurality of memory dies (e.g., each of dies 12, 14, 16, 18, 20, 22, 24, 26, 28, 30) of DDR6 memory module 10) may be protected via RS parities 210 (which is 16-bits long), RS parities 212 (which is 16-bits long) for a total of 32-bits, resulting in 8-bits being made available for storing of metadata 214, 216.

Data Recovery:

Data protection process 100 may recover 108 one or more portions of the data (e.g., data 202) and metadata included within each of the plurality of memory dies (e.g., each of dies 12, 14, 16, 18, 20, 22, 24, 26, 28, 30) of the DDR6 memory module (e.g., DDR6 memory module 10) in the event of data corruption and/or die failure using one or more of the encoded symbols (e.g., symbols S11, S21, S31, S41, S51, S61, S71, S81, S91, S101 and/or symbols S12, S22, S32, S42, S52, S62, S72, S82, S92, S102) and the RS parities (e.g., RS parities 210 and/or RS parities 212).

The following examples lay out various failure scenarios of DDR6 memory module 10 and the manner in which data protection process 100 may recover 108 lost/corrupted data.

Standard Chip Kill:

Referring also to FIG. 4, assume that the first die (e.g., die 12) has failed (i.e., one through all stored bits return errors).

Being that S11 & S12 are generated based upon the first die (e.g., die 12) . . . they are corrupted.

And being P11 is stored on the first die (e.g., die 12) . . . P11 is also corrupted.

For RS(15,11) encoding, there are four parities, thus allowing for the correction of two symbol errors (when the location of no errors is known), three symbol errors (when the location of two errors is known) or four symbol errors (when the location of four errors is known).

The (upper) inner RS (CW2) has a single error (S12). Being the (upper) inner RS (CW2) has four parities, it can correct two symbol errors (when the location of the errors is unknown). Accordingly, the (upper) inner RS (CW2) can correct the error with symbol S12.

The (lower) inner RS (CW1) has two errors (P11 & S11). Being the (lower) inner RS (CW1) has four parities, it can correct two symbol errors (when the location of the errors is unknown). Accordingly, the (lower) inner RS (CW1) can correct the errors with symbols P11 & S11.

Figure 5:
FIG. 5 is a diagrammatic view of a second failure type of the DDR6 memory of FIG. 1.

Chip Kill on Metadata:

Referring also to FIG. 5, assume that the ninth die (e.g., die 28) has failed (i.e., one through all stored bits return errors).

Being that S91 & S92 are generated based upon the ninth die (e.g., die 28) . . . they are corrupted.

And being M1 is stored on the ninth die (e.g., die 28) . . . M1 is also corrupted.

For RS(15,11) encoding, there are four parities, thus allowing for the correction of two symbol errors (when the location of no errors is known), three symbol errors (when the location of two errors is known) or four symbol errors (when the location of four errors is known).

The (upper) inner RS (CW2) has a single error (S92). Being the (upper) inner RS (CW2) has four parities, it can correct two symbol errors (when the location of the errors is unknown). Accordingly, the (upper) inner RS (CW2) can correct the error with symbol S92.

The (lower) inner RS (CW1) has two errors (M1 & S91). Being the (lower) inner RS (CW1) has four parities, it can correct two symbol errors (when the location of the errors is unknown). Accordingly, the (lower) inner RS (CW1) can correct the errors with symbols M1 & S91.

Figure 6:
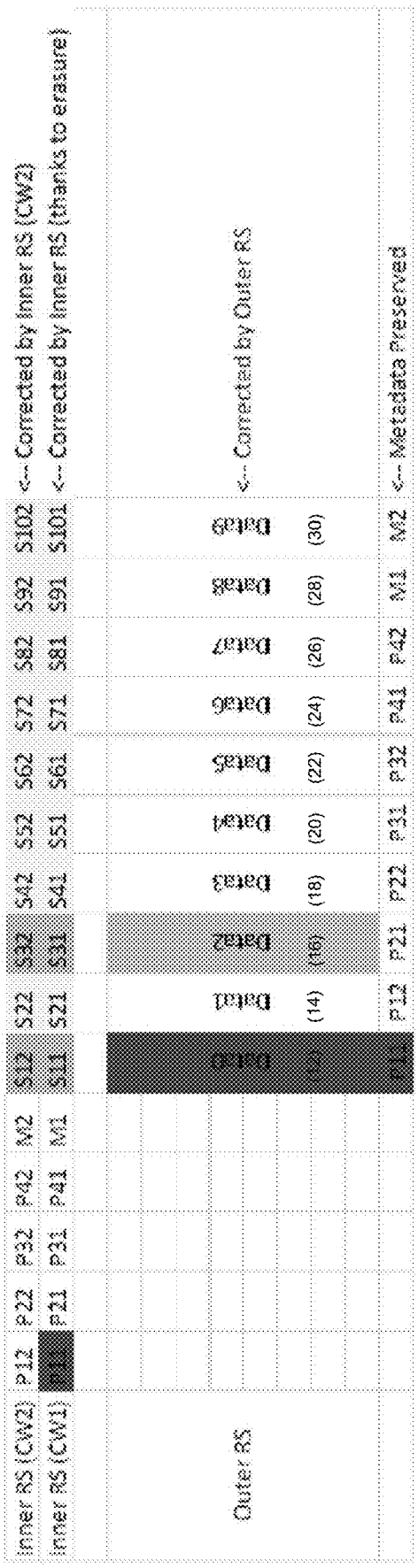
FIG. 6 is a diagrammatic view of a third failure type of the DDR6 memory of FIG. 1.

Chip Kill with Single Error in Another Data Block:

Referring also to FIG. 6, assume that the first die (e.g., die 12) has failed (i.e., one through all stored bits return errors).

Being that S11 & S12 are generated based upon the first die (e.g., die 12) . . . they are corrupted.

And being P11 is stored on the first die (e.g., die 12) . . . P11 is also corrupted.

Assume that the third die (e.g., die 16) has one or more data errors.

Being that S31 & S32 are generated based upon the third die (e.g., die 16) . . . they are corrupted.

For RS(15,11) encoding, there are four parities, thus allowing for the correction of two symbol errors (when the location of no errors is known), three symbol errors (when the location of two errors is known) or four symbol errors (when the location of four errors is known).

The (upper) inner RS (CW2) has two errors (S12 & S32). Being the (upper) inner RS (CW2) has four parities, it can correct two symbol errors (when the location of the errors is unknown). Accordingly, the (upper) inner RS (CW2) can correct the error with symbols S12 & S32.

The (lower) inner RS (CW1) has three errors (P11, S11 & S31). Being the (lower) inner RS (CW1) has four parities, it can correct two symbol errors (when the location of no errors is known), three symbol errors (when the location of two errors is known) or four symbol errors (when the location of four errors is known).

S12 is corrupt and is associated with the first die (e.g., die 12). Being S11 is associated with S12, the location of error S11 is the first die (e.g., die 12).

S32 is corrupt and is associated with the third die (e.g., die 16). Being S31 is associated with S32, the location of error S31 is the third die (e.g., die 16).

P11 is corrupt and is associated with the first die (e.g., die 12). Being P11 is stored on the first die (e.g., die 12), the location of error P11 is the first die (e.g., die 12).

While (lower) inner RS (CW1) has three symbol errors (P11, S11 & S31), being the location of these three symbol errors is known, the (lower) inner RS (CW1) can correct the errors with symbols P11, S11 & S31.

Figure 7:
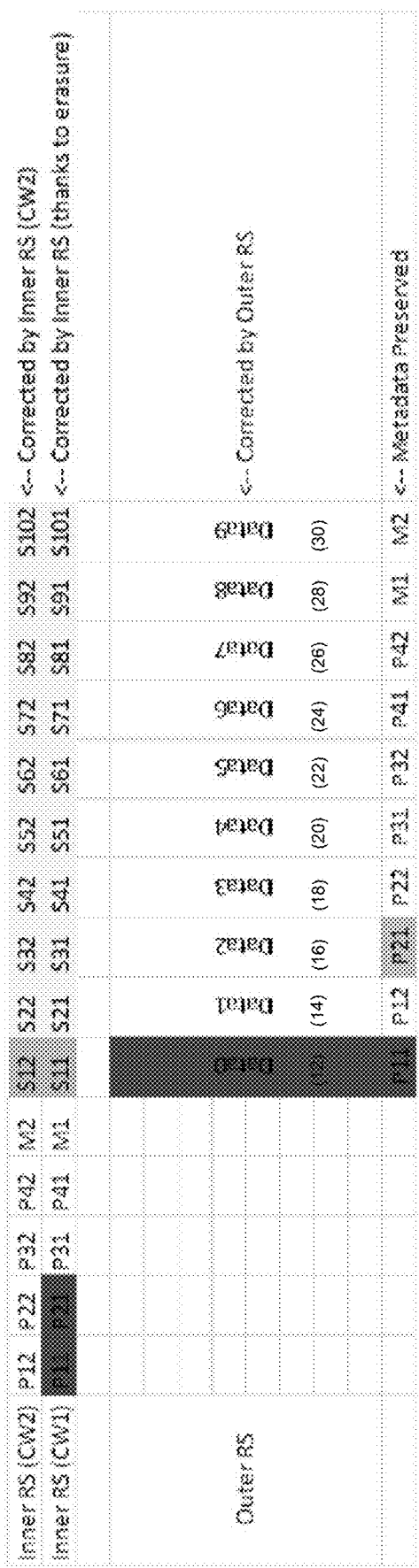
FIG. 7 is a diagrammatic view of a fourth failure type of the DDR6 memory of FIG. 1.

Chip Kill with Single Error in Extra Data Block:

Referring also to FIG. 7, assume that the first die (e.g., die 12) has failed (i.e., one through all stored bits return errors).

Being that S11 & S12 are generated based upon the first die (e.g., die 12) . . . they are corrupted.

And being P11 is stored on the first die (e.g., die 12) . . . . P11 is also corrupted.

Assume that the third die (e.g., die 16) has an error in parity (P21).

Being the data within the third die (e.g., die 16) is not corrupted, S31 & 32 are not corrupted.

For RS(15,11) encoding, there are four parities, thus allowing for the correction of two symbol errors (when the location of no errors is known), three symbol errors (when the location of two errors is known) or four symbol errors (when the location of four errors is known).

The (upper) inner RS (CW2) has a single error (S12). Being the (upper) inner RS (CW2) has four parities, it can correct two symbol errors (when the location of the errors is unknown). Accordingly, the (upper) inner RS (CW2) can correct the error with symbol S12.

The (lower) inner RS (CW1) has three errors (P11, P21 & S11). Being the (lower) inner RS (CW1) has four parities, it can correct two symbol errors (when the location of no errors is known), three symbol errors (when the location of two errors is known) or four symbol errors (when the location of four errors is known).

S12 is corrupt and is associated with the first die (e.g., die 12). Being S11 is associated with S12, the location of error S11 is the first die (e.g., die 12).

P11 is corrupt and is associated with the first die (e.g., die 12). Being P11 is stored on the first die (e.g., die 12), the location of error P11 is the first die (e.g., die 12).

P21 is corrupt and is associated with the third die (e.g., die 16). Being P21 is stored on the third die (e.g., die 16), the location of error P21 is the third die (e.g., die 16).

While (lower) inner RS (CW1) has three symbol errors (P11, P21 & S11), being the location of these symbol errors is known, the (lower) inner RS (CW1) can correct the errors with symbols P11, P21 & S11.

Figure 8:
FIG. 8 is a diagrammatic view of a fifth failure type of the DDR6 memory of FIG. 1.

Chip Kill with Single Error in Data and Single Error in Extra Data Block:

Referring also to FIG. 8, assume that the first die (e.g., die 12) has failed (i.e., one through all stored bits return errors).

Being that S11 & S12 are generated based upon the first die (e.g., die 12) . . . they are corrupted.

And being P11 is stored on the first die (e.g., die 12) . . . . P11 is also corrupted.

Assume that the third die (e.g., die 16) has one or more data errors and an error in parity (P21).

Being that S31 & S32 are generated based upon the third die (e.g., die 16) . . . they are corrupted.

For RS(15,11) encoding, there are four parities, thus allowing for the correction of two symbol errors (when the location of no errors is known), three symbol errors (when the location of two errors is known) or four symbol errors (when the location of four errors is known).

The (upper) inner RS (CW2) has two errors (S12 & S32). Being the (upper) inner RS (CW2) has four parities, it can correct two symbol errors (when the location of the errors is unknown). Accordingly, the (upper) inner RS (CW2) can correct the error with symbols S12 & S32.

The (lower) inner RS (CW1) has four errors (P11, P21, S11 & S31). Being the (lower) inner RS (CW1) has four parities, it can correct two symbol errors (when the location of no errors is known), three symbol errors (when the location of two errors is known) or four symbol errors (when the location of four errors is known).

S12 is corrupt and is associated with the first die (e.g., die 12). Being S11 is associated with S12, the location of error S11 is the first die (e.g., die 12).

S32 is corrupt and is associated with the third die (e.g., die 16). Being S31 is associated with S32, the location of error S31 is the third die (e.g., die 16).

P11 is corrupt and is associated with the first die (e.g., die 12). Being P11 is stored on the first die (e.g., die 12), the location of error P11 is the first die (e.g., die 12).

P21 is corrupt and is associated with the third die (e.g., die 16). Being P21 is stored on the third die (e.g., die 16), the location of error P21 is the third die (e.g., die 16).

While (lower) inner RS (CW1) has four symbol errors (P11, P21, S11 & S31), being the location of these symbol errors is known, the (lower) inner RS (CW1) can correct the errors with symbols P11, P21, S11 & S31.

Single RS Code Calculation:

In some situations, it may be desirable to reduce the number of Reed-Solomon code calculations performed by data protection process 100 (e.g., to reduce computational requirements/overhead). Accordingly and in such a situation, data protection process 100 may be configured to perform a single Reed-Solomon calculation.

Figure 9:
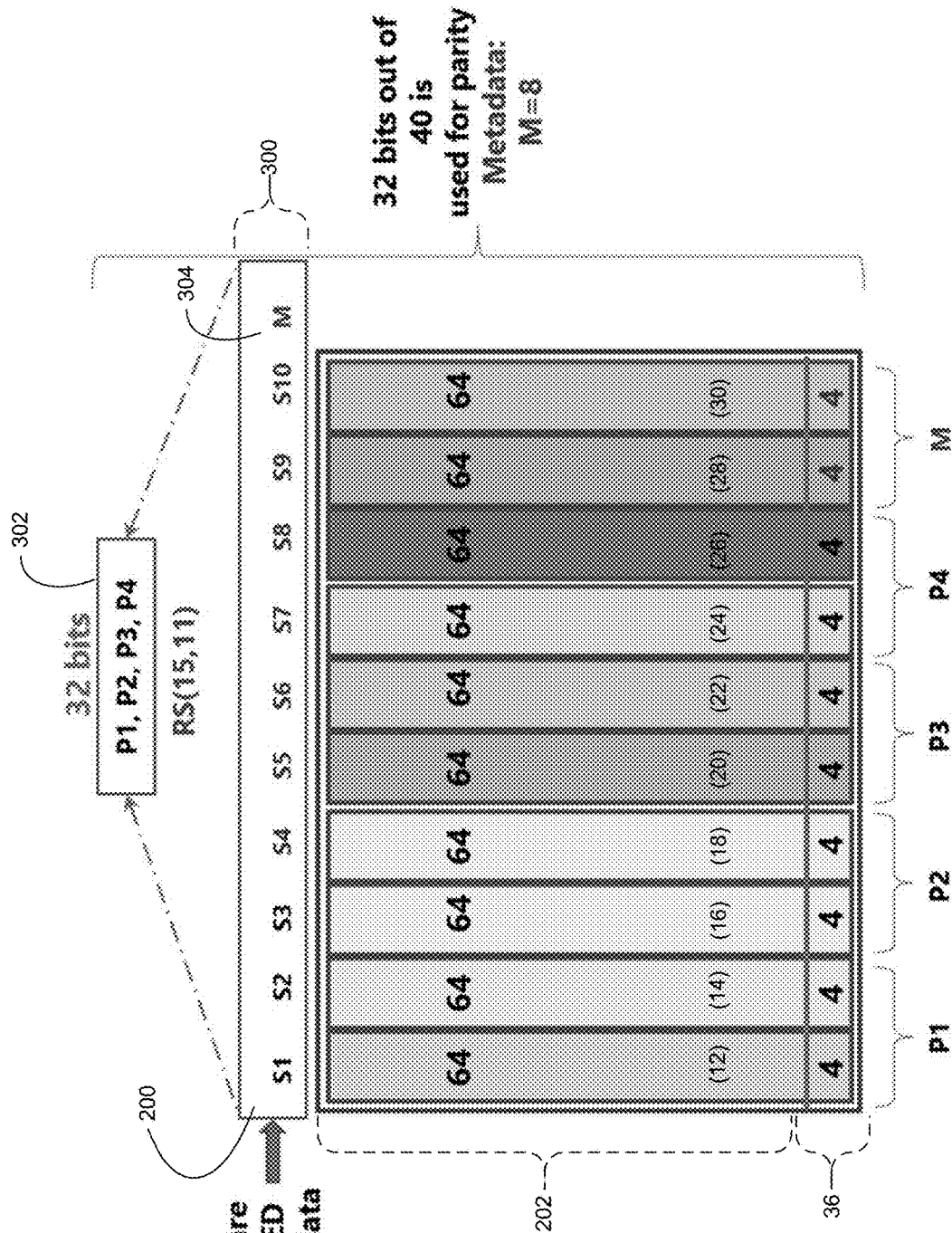
FIG. 9 is a diagrammatic view of a DDR6 memory and another implementation of the data protection process of FIG. 2.

For example and referring also to FIG. 9, the one or more encoded symbols (e.g. encoded symbols 200) for data (e.g., data 202) included within each of a plurality of memory dies (e.g., each of dies 12, 14, 16, 18, 20, 22, 24, 26, 28, 30) of a DDR6 memory module (e.g., DDR6 memory module 10) may include: one 8-bit encoded symbol for data (e.g., data 202) included within each of a plurality of memory dies (e.g., each of dies 12, 14, 16, 18, 20, 22, 24, 26, 28, 30) of a DDR6 memory module (e.g., DDR6 memory module 10), thus defining one group of 8-bit encoded symbols (e.g. encoded symbol group 300), resulting in an 8-bit symbol for each of dies 12, 14, 16, 18, 20, 22, 24, 26, 28, 30. As will be discussed below in greater detail, one symbol group (e.g., encoded symbol group 300) is formed to allow for the generation of one distinct RS parity (i.e., for encoded symbol group 300).

For example and through the use of the above-described SECDED algorithm:

the data included within die 12 of DDR6 memory module 10 may generate 8-bit symbol S1 that is representative of such data and allow for its recovery in the event of corruption;

the data included within die 14 of DDR6 memory module 10 may generate 8-bit symbol S2 that is representative of such data and allow for its recovery in the event of corruption;

the data included within die 16 of DDR6 memory module 10 may generate 8-bit symbol S3 that is representative of such data and allow for its recovery in the event of corruption;

the data included within die 18 of DDR6 memory module 10 may generate 8-bit symbol S4 that is representative of such data and allow for its recovery in the event of corruption;

the data included within die 20 of DDR6 memory module 10 may generate 8-bit symbol S5 that is representative of such data and allow for its recovery in the event of corruption;

the data included within die 22 of DDR6 memory module 10 may generate 8-bit symbol S6 that is representative of such data and allow for its recovery in the event of corruption;

the data included within die 24 of DDR6 memory module 10 may generate 8-bit symbol S7 that is representative of such data and allow for its recovery in the event of corruption;

the data included within die 26 of DDR6 memory module 10 may generate 8-bit symbol S8 that is representative of such data and allow for its recovery in the event of corruption;

the data included within die 28 of DDR6 memory module 10 may generate 8-bit symbol S9 that is representative of such data and allow for its recovery in the event of corruption; and the data included within die 30 of DDR6 memory module 10 may generate 8-bit symbol S10 that is representative of such data and allow for its recovery in the event of corruption.

When generating 104 RS parities for each group of encoded symbols, data protection process 100 may generate 110 the RS parities (e.g., RS parities 302) for the one group of 8-bit encoded symbols (e.g., encoded symbol group 300).

For example, data protection process 100 may generate 110 a 32-bit RS parity (e.g., RS parity 302) for encoded symbol group 300 by processing the ten 8-bit symbols (e.g., symbols S1, S2, S3, S4, S5, S6, S7, S8, S9, S10) included within encoded symbol group 300. In this particular example, RS parity 302 is 32 bits in total length and includes four 8-bit parities (e.g., P1, P2, P3, P4).

As discussed above, RS(15,11) refers to a Reed-Solomon code with 8-bit symbols that processes 11 input symbols to generate 4 parity symbols (for a total of 15 symbols). Since encoded symbol group 300 includes only ten 8-bit symbols (e.g., symbols S1, S2, S3, S4, S5, S6, S7, S8, S9, S10), one 8-bit symbol is available for storing 8-bits of metadata (e.g., metadata 304).

As discussed above, each of the ten dies (e.g., dies 12, 14, 16, 18, 20, 22, 24, 26, 28, 30) included within DDR6 memory module 10 includes sixty-four data storage bits (e.g., data storage bits 34) and four additional bits (e.g., additional bits 36) for use in protecting the data stored within data storage bits 34. Accordingly and through the use of data protection process 100, the data (e.g., data 202) included within each of a plurality of memory dies (e.g., each of dies 12, 14, 16, 18, 20, 22, 24, 26, 28, 30) of DDR6 memory module 10) may be protected via RS parity 302 (overall 32-bit long), resulting in 8-bits being made available for storing of metadata 304.

System Overview:

In some implementations, data protection process 100 may be implemented as an entirely hardware embodiment, an entirely software embodiment (including firmware, resident software, micro-code, etc.) or an embodiment combining software and hardware aspects that may all generally be referred to herein as a "circuit," "module", "process" or "system.".

The instruction sets and subroutines of data protection process 100, which may be stored on storage device 58 coupled to DDR6 memory module 10, may be executed by one or more processors (e.g., processor 60) and one or more memory architectures (e.g., memory architecture 62) included within DDR6 memory module 10. Examples of storage device 58 may include but are not limited to: a random access memory (RAM); a read-only memory (ROM); and all forms of flash memory storage devices.

General:

The present disclosure may be embodied as a method, a system, or a computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module", "process" or "system." Furthermore, the present disclosure may take the form of a computer program product on a computer-usable storage medium having computer-usable program code embodied in the medium.

Any suitable computer usable or computer readable medium may be used. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. The computer-usable or computer-readable medium may also be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to the Internet, wireline, optical fiber cable, RF, etc.

Computer program code for carrying out operations of the present disclosure may be written in an object-oriented programming language. However, the computer program code for carrying out operations of the present disclosure may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network/a wide area network/the Internet.

The present disclosure is described with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, may be implemented by computer program instructions. These computer program instructions may be provided to a processor of a general-purpose computer/special purpose computer/other programmable data processing apparatus, such that the instructions, which execute via the processor of the computer or other programmable data processing apparatus, create means for implementing the functions/acts specified in the flowchart and/or block diagram block or blocks.

These computer program instructions may also be stored in a computer-readable memory that may direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

The flowcharts and block diagrams in the figures may illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, not at all, or in any combination with any other flowcharts depending upon the functionality involved. It will also be noted that each block of the block diagrams and/or flowchart illustrations, and combinations of blocks in the block diagrams and/or flowchart illustrations, may be implemented by special purpose hardware-based systems that perform the specified functions or acts, or combinations of special purpose hardware and computer instructions.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

A number of implementations have been described. Having thus described the disclosure of the present application in detail and by reference to embodiments thereof, it will be apparent that modifications and variations are possible without departing from the scope of the disclosure defined in the appended claims.

What is claimed is:

1. A computer-implemented method, executed on a computing device, comprising:
    defining one or more encoded symbols for data included within each of a plurality of memory dies of a memory module to define one or more groups of encoded symbols, wherein the one or more encoded symbols for data included within each of the plurality of memory dies of the memory module includes two 4-bit encoded symbols for data included within each of the plurality of memory dies of the memory module;
    generating Reed-Solomon parities for each group of encoded symbols, wherein generating the Reed Solomon parities for each group includes generating two distinct Reed-Solomon parities with one Reed-Solomon parity for each of the two groups of 4-bit encoded symbols with one 4-bit symbol available for storing 4-bits of metadata; and
    recovering one or more portions of the data included within each of the plurality of memory dies of the memory module in the event of data corruption or die failure using one or more of the encoded symbols and the Reed-Solomon parities.

2. The computer implemented method of claim 1 wherein the one or more encoded symbols for data included within each of a plurality of memory dies of a memory module includes:
    one 8-bit encoded symbol for data included within each of a plurality of memory dies of a memory module, thus defining one group of 8-bit encoded symbols.

3. The computer implemented method of claim 2 wherein generating Reed-Solomon parities for each group of encoded symbols includes:

generating the Reed-Solomon parities for the one group of 8-bit encoded symbols.

4. The computer implemented method of claim 1 wherein:
the one or more encoded symbols includes one or more Single Error Correction/Double Error Detection (SECDED) encoded symbols.

5. A computer program product residing on a non-transitory computer readable medium having a plurality of instructions stored thereon which, when executed by a processor, cause the processor to perform operations comprising:
defining one or more encoded symbols for data included within each of a plurality of memory dies of a memory module to define one or more groups of encoded symbols, wherein the one or more encoded symbols for data included within each of the plurality of memory dies of the memory module includes two 4-bit encoded symbols for data included within each of the plurality of memory dies of the memory module;
generating Reed-Solomon parities for each group of encoded symbols, wherein generating the Reed Solomon parities for each group includes generating two distinct Reed-Solomon parities with one Reed-Solomon parity for each of the two groups of 4-bit encoded symbols with one 4-bit symbol available for storing 4-bits of metadata; and
recovering one or more portions of the data included within each of the plurality of memory dies of the memory module in the event of data corruption or die failure using one or more of the encoded symbols and the Reed-Solomon parities.

6. The computer program product of claim 5 wherein the one or more encoded symbols for data included within each of a plurality of memory dies of a memory module includes:
one 8-bit encoded symbol for data included within each of a plurality of memory dies of a memory module, thus defining one group of 8-bit encoded symbols.

7. The computer program product of claim 6 wherein generating Reed-Solomon parities for each group of encoded symbols includes:
generating the Reed-Solomon parities for the one group of 8-bit encoded symbols.

8. The computer program product of claim 5 wherein:
the one or more encoded symbols includes one or more Single Error Correction/Double Error Detection (SECDED) encoded symbols.

9. A computing system including a processor and memory configured to perform operations comprising:
defining one or more encoded symbols for data included within each of a plurality of memory dies of a memory module to define one or more groups of encoded symbols, wherein the one or more encoded symbols for data included within each of the plurality of memory dies of the memory module includes two 4-bit encoded symbols for data included within each of the plurality of memory dies of the memory module;
generating Reed-Solomon parities for each group of encoded symbols, wherein generating the Reed Solomon parities for each group includes generating two distinct Reed-Solomon parities with one Reed-Solomon parity for each of the two groups of 4-bit encoded symbols with one 4-bit symbol available for storing 4-bits of metadata; and
recovering one or more portions of the data included within each of the plurality of memory dies of the memory module in the event of data corruption or die failure using one or more of the encoded symbols and the Reed-Solomon parities.

10. The computing system of claim 9 wherein the one or more encoded symbols for data included within each of a plurality of memory dies of a memory module includes:
one 8-bit encoded symbol for data included within each of a plurality of memory dies of a memory module, thus defining one group of 8-bit encoded symbols.

11. The computing system of claim 10 wherein generating Reed-Solomon parities for each group of encoded symbols includes:
generating the Reed-Solomon parities for the one group of 8-bit encoded symbols.

12. The computing system of claim 9 wherein:
the one or more encoded symbols includes one or more Single Error Correction/Double Error Detection (SECDED) encoded symbols.

* * * * *